United States Patent
Wolf et al.

(10) Patent No.: US 9,235,053 B2
(45) Date of Patent: Jan. 12, 2016

(54) DEVICE AND METHOD FOR BEAM SHAPING

(75) Inventors: Jürgen Wolf, Schloeben (DE); Steffen Wagner, München (DE)

(73) Assignee: JENOPTIK Laser GmbH, Jena (DE)

( * ) Notice: Subject to any disclaimer, the term of this patent is extended or adjusted under 35 U.S.C. 154(b) by 440 days.

(21) Appl. No.: 13/809,345

(22) PCT Filed: Jul. 8, 2011

(86) PCT No.: PCT/EP2011/061613
§ 371 (c)(1),
(2), (4) Date: Apr. 2, 2013

(87) PCT Pub. No.: WO2012/004381
PCT Pub. Date: Jan. 12, 2012

(65) Prior Publication Data
US 2013/0194801 A1    Aug. 1, 2013

(30) Foreign Application Priority Data

Jul. 9, 2010    (DE) .......................... 10 2010 031 199

(51) Int. Cl.
*F21V 7/04*      (2006.01)
*G02B 27/09*    (2006.01)
*H01S 5/40*      (2006.01)
*G02B 19/00*    (2006.01)
*H01S 5/00*      (2006.01)
*H01S 5/20*      (2006.01)

(52) U.S. Cl.
CPC ........ *G02B 27/0977* (2013.01); *G02B 19/0028* (2013.01); *G02B 19/0057* (2013.01); *G02B 27/0905* (2013.01); *H01S 5/4012* (2013.01); *H01S 5/4025* (2013.01); *H01S 5/0071* (2013.01); *H01S 5/2036* (2013.01)

(58) Field of Classification Search
CPC .......... G02B 19/0028; G02B 19/0057; G02B 27/0905; G02B 27/0977; H01S 5/0071; H01S 5/005; H01S 5/4012; H01S 5/4025; H01S 5/2036; F21V 13/04
USPC .................. 362/553, 297, 299, 311.1, 311.06
See application file for complete search history.

(56) References Cited

U.S. PATENT DOCUMENTS

| | | |
|---|---|---|
| 4,958,893 A | 9/1990 | Noguchi et al. |
| 5,808,323 A | 9/1998 | Spaeth et al. |

(Continued)

FOREIGN PATENT DOCUMENTS

WO        01/06297 A2    1/2001

OTHER PUBLICATIONS

English translation of International Preliminary Report on Patentability for PCT/EP2011/061613, Jan. 24, 2013, 14 pages.

*Primary Examiner* — Sean Gramling
*Assistant Examiner* — Naomi M Wolford
(74) *Attorney, Agent, or Firm* — Skaar Ulbrich Macari, P.A.

(57) ABSTRACT

A device for beam shaping includes a heat dissipation body having an upper side with a planar section and a plurality of laser elements next to one another on the planar section of the upper side that respectively emit a ray bundle having a fast-axis divergence and, perpendicular thereto, a slow-axis divergence. A reflection element is arranged such that the ray bundles of the individual laser elements extend parallel to one another and at an elevation angle of greater than 0° and less than 90° with respect to the planar section after exactly one reflection at the associated reflection element. The reflected ray bundles are stacked in the optical path downstream of the reflection elements in a first plane perpendicular to the beam direction and a connecting line, lying in the first plane, of the centers of the reflected ray bundles extends perpendicular to the direction of the slow axis.

28 Claims, 7 Drawing Sheets

(56) References Cited

U.S. PATENT DOCUMENTS

| | | |
|---|---|---|
| 5,887,096 A | 3/1999 | Du et al. |
| 6,124,973 A * | 9/2000 | Du et al. ............... 359/618 |
| 6,229,831 B1 * | 5/2001 | Nightingale et al. ........ 372/36 |
| 6,240,116 B1 | 5/2001 | Lang et al. |
| 6,254,287 B1 | 7/2001 | Groetsch et al. |
| 7,668,214 B2 | 2/2010 | Wilson et al. |
| 2008/0084905 A1 | 4/2008 | Doerfel et al. |
| 2009/0011531 A1 | 1/2009 | Yang |

* cited by examiner

DEVICE AND METHOD FOR BEAM SHAPING

PRIORITY

This application claims the benefit of International Application PCT/EP2011/061613 filed on Jul. 8, 2011, and German Patent Application No. 102010031199.5, filed on Jul. 9, 2010, both of which are hereby incorporated herein by reference in their entirety.

FIELD

The present invention relates to a device for beam shaping the ray bundles of a plurality of laser elements which are positioned on a heat dissipation body.

BACKGROUND

By way of example, DE 197 80 124 B4 has disclosed such a device, wherein the upper side of the heat dissipation body has a stepped design such that the laser elements arranged next to one another respectively emit their ray bundles at different heights. These ray bundles are then deflected by 90° with deflection mirrors such that the individual ray bundles are situated directly over one another and form a common ray bundle. Here, the normal of the deflection mirror lies in the waveguide plane of the laser element, and so the emitted and reflected ray bundles also lie in this plane. As a result of the stepped embodiment of the upper side, the waveguide planes of the laser elements are, as it were, stacked over one another and the laser elements are not situated in a common plane.

A disadvantage of this design is, firstly, that the heat dissipation is very inhomogeneous as a result of the stepped design of the heat dissipation body. Temperature differences of between 1 and 4° C. and even more can by all means occur between steps. In the case of a temperature dependence of the wavelength of the laser radiation of approximately 0.4 nm per °C. and a bandwidth of the emitted laser radiation of between 3 and 4 nm, this leads to a noticeable and undesirable displacement of the wavelength of the ray bundles.

Moreover, fabricating an upper side of the heat dissipation body with such steps is very complicated and only possible to an accuracy of approximately a few tens of μm.

U.S. Pat. No. 6,229,831 B1 has disclosed a device for beam shaping, in which the individual laser elements are arranged on a planar upper side of a heat dissipation body via wedge elements. The wedge elements are selected such that the incline of the upper side with respect to the horizontal is compensated for, and so the individual laser elements emit the ray bundles thereof in the horizontal direction.

The alignment by means of the wedge elements is complicated in this embodiment. The heat dissipation is also uneven in each individual laser element as a result of the wedge elements, and this is disadvantageous. Moreover, the heat dissipation is degraded as a result of the additional joints in the heat dissipation path.

DE 195 11 593 A1 (e.g. FIG. 4) has disclosed a device in which a deflection mirror arrangement is used to stack the ray bundles from a linear arrangement of laser elements over one another such that the envelope of the beam cross section is a rectangle. A disadvantage of this arrangement is that at least two reflections are required per laser element for this purpose. Furthermore, DE 195 11 593 A1 (FIG. 7) has disclosed a device in which a deflection mirror arrangement is used to stack the ray bundles from a linear arrangement of laser elements over one another. Only one reflection is required for this, but a disadvantage of this arrangement is that the envelope of the beam cross section is trapezoidal. This means that the connecting line of the centers of the ray bundles is not perpendicular to the slow-axis direction of the ray bundles. Coupling the radiation into an optical fiber is therefore connected with a loss of beam quality and/or coupling efficiency.

SUMMARY

Proceeding therefrom, it is an object of the invention to provide an improved device for beam shaping. Furthermore, provision should be made for a corresponding method for beam shaping.

The object is achieved by a device for beam shaping, comprising a heat dissipation body, which has an upper side with a planar section, and, arranged next to one another (preferably in a plane) on the planar section, a plurality of laser elements, which respectively emit a ray bundle which has a fast-axis divergence and, perpendicular thereto, a slow-axis divergence, wherein a reflection element is associated with each laser element, the former being arranged such that the ray bundles of the individual laser elements extend parallel to one another and at an elevation angle of greater than 0° and less than 90° with respect to the planar section after exactly one reflection at the associated reflection element, wherein the reflected ray bundles of the individual laser elements are stacked in the optical path downstream of the reflection elements in a first plane perpendicular to the beam direction of the reflected ray bundles and a connecting line, lying in the first plane, of the centers of the reflected ray bundles extends perpendicular to the direction of the slow axis.

In the device according to the invention for beam shaping, the laser elements are arranged on the planar or flat section (preferably directly on the planar section) of e.g. the upper side of a heat sink such that excellent and homogeneous heat dissipation is possible. The slow-axis direction of the laser elements is preferably in a common plane. This arrangement of the laser elements is possible as a result of the arrangement of the reflection elements because, after the reflection, the ray bundles respectively have one and the same elevation angle of greater than 0° and less than 90° and, as a result thereof, can as it were be stacked over one another for a common emergent ray bundle. Since the connecting line, lying in the first plane, of the centers of the reflected ray bundles extends perpendicular to the direction of the slow axis, it is possible to provide a ray bundle stack whose envelope in the first plane is a rectangle.

Furthermore, the object is achieved by a device for beam shaping, comprising a heat dissipation body, which has an upper side with a planar section, and, arranged next to one another (preferably in a plane) on the planar section, a plurality of laser elements, which respectively emit a ray bundle, wherein a reflection element is associated with each laser element, the former being arranged such that the ray bundles of the individual laser elements extend parallel to one another and at an elevation angle of greater than 0° and less than 90° with respect to the planar section after exactly one reflection at the associated reflection element, wherein the reflected ray bundles of the individual laser elements are stacked in the optical path downstream of the reflection elements in a first plane perpendicular to the beam direction of the reflected ray bundles and the envelope of the reflected ray bundles in the first plane is a rectangle.

In particular, the reflected ray bundles can be stacked in parallel or else stacked in parallel in a striped fashion in the first plane.

In the device according to the invention, the emission directions of the ray bundles emitted by the laser elements can extend parallel to one another in an emission plane.

Furthermore, in the device according to the invention, the reflected ray bundles, as seen in a projection onto the emission plane, can be arranged offset perpendicular to the propagation directions.

In the device according to the invention, the spacing between the laser elements in a first direction (x-direction) extending perpendicular to the emission directions can be different from the spacing between the associated reflection elements in the first direction. In particular, the spacing between the associated reflection elements in the first direction can be greater than the spacing between the laser elements in the first direction.

Moreover, adjacent reflection elements can, in the device according to the invention, be arranged offset with respect to one another in the emission direction (z-direction). In particular, it is possible for the reflection elements to be arranged in succession in the direction of the reflected ray bundles and for each reflection element, with respect to the preceding reflection element, to be arranged offset toward the associated laser element in the emission direction.

Moreover, it is possible for the reflection elements to be oriented such that the azimuth angles of the reflected ray bundles are all not equal to 90°. All azimuth angles should advantageously be equal. They can be greater than, equal to, or else less than 90°.

The emission plane preferably lies parallel to the planar section.

In particular, the planar section of the upper side can be embodied as a contiguous section. However, it is also possible for recesses to be formed in the upper side between the adjacently arranged laser elements, said recesses leading to the planar section being interrupted between the laser elements. According to the invention, an essential point is that the regions on the upper side on which the laser elements are positioned lie in the same plane and, as a result thereof, form the planar section. However, it is preferable for the planar section to be embodied as continuous or contiguous section of the upper side.

Furthermore, the laser elements are preferably positioned directly on the planar section.

Here, the elevation angle is understood to mean the angle between the ray bundle downstream of the reflection element and the planar section. It is thus possible to say that the reference plane for the elevation angle is therefore the plane in which the planar section of the heat dissipation body lies. The elevation angles just like the azimuth angles of all ray bundles should advantageously be equal.

The laser elements are preferably semiconductor laser elements or laser diodes. These can be separate laser elements and/or laser bars. A person skilled in the art is aware of the fact that the laser elements can be made from a submount with a laser chip placed thereon. The submount can preferably consist of a highly heat-conducting material, such as e.g. diamond, tungsten-copper or ceramics (e.g. BeO or AlN), or comprise the latter. The submount can furthermore be metalized, with the laser chip being soldered onto the metallization. The laser diodes are preferably embodied as broad-stripe emitters, which emit single-mode radiation along a "fast axis" and multimode radiation along a "slow axis". The laser resonators of these multimode laser diodes are embodied as planar waveguides. The light emergence surfaces of these laser diodes have a very low height compared to their width and therefore constitute approximately line-shaped beam sources.

In the device according to the invention, the ray bundles emitted by the laser elements can extend parallel to one another in an emission plane, which preferably lies parallel to the planar section. This design can be realized particularly easily. In particular, it is possible to use identically designed laser elements. Here, parallel is understood to mean that, in particular, precise mathematical parallelism is present as far as possible. However, there may deliberately or inadvertently be deviations of the order of single-digit degrees, which should then still be considered to be parallel.

As a result of the above-described arrangement according to the invention, the waveguides of the laser resonators lie in a plane that is parallel to the emission plane or coincides with the latter. These beam emergence surfaces can therefore lie either in a common plane, which is preferably perpendicular to the emission plane, or in mutually parallel planes, which in turn are preferably perpendicular to the emission plane.

The reflection elements are preferably arranged such that the elevation angle of the reflected radiation is less than 45°, more particularly between 2°-40° or 3°-15° and particularly preferably between 5°-10°. This is particularly advantageous for providing a compact device for beam shaping.

The elevation angle is advantageously selected such that the ray bundles lie as closely as possible over one another downstream of the reflection element, without significant shadowing occurring. If the elevation angle is too large, the ray bundles lie unnecessarily far apart. If the elevation angle is too small, the ray bundles are respectively partly or too strongly shadowed at the reflection element of the following beam path. Moreover, another small part of the radiation, which radiates over the upper edge of the respectively associated reflection element, is lost. However, a small loss of a few percent as a result of both effects, i.e. as a result of shadowing by the reflection element of the respectively adjacent beam path and by radiation over the upper edges of the respectively associated reflection element, can be accepted in order to obtain a radiation field that is as compact as possible.

Furthermore, the reflection elements can also be arranged such that the ray bundles of the individual laser elements extend at an azimuth angle of at least 30° and at most 150° with respect to the emission direction of the laser elements after reflection at the reflection elements. Here, the azimuth angle is the angle of the reflected ray bundles projected perpendicularly onto the emission plane, with respect to the emission direction of the laser elements. This leads to a very compact device.

The azimuth angle can be 90°, but this need not be the case. It preferably lies between 80° and 100°, and more particularly between 87° and 93°.

The ray bundles of the individual laser elements are preferably stacked in parallel in a striped fashion in a first plane perpendicular to the beam direction of the reflected ray bundles in the optical path downstream of the reflection elements. Here, the envelope of the reflected ray bundles can be a rectangle if the extent of all reflected ray bundles in the first plane is equal in the direction of the slow axis. In particular, the reflected ray bundles can, as seen in a projection onto the emission plane, be offset with respect to one another but extend in the same direction.

In the device according to the invention, it is possible for at least two of the reflection elements to be embodied as a contiguous component. By way of example, the reflection elements can be embodied as individual surfaces of a copper mirror component. The reflection elements can naturally also be separate elements.

The heat dissipation body can have an at least partly wedge-shaped design. In particular, the angle between the planar section of the upper side and a lower side of the heat dissipation body can correspond to the elevation angle. In this case, the emergent ray bundle can extend horizontally or parallel to the lower side.

Alternatively, it is possible for the heat dissipation body to be designed as a substantially plane-parallel plate. In this case, it can be produced particularly easily with the desired accuracy.

The heat dissipation body can consist of a highly heat-conducting material, in particular copper or a copper alloy or aluminum or a composite material. The reflection elements can be embodied as metallic surfaces or as metallic or as dielectric layers on a substrate.

The beam shaping device preferably has an optical focusing element, which focuses the reflected ray bundles. The focusing element is preferably refractive and can have an element or else a plurality of elements. By way of example, this renders it possible to couple the laser radiation into an optical fiber with e.g. a round or rectangular, specifically e.g. square, core cross section.

The device can have at least one first optical element for collimating the ray bundle (at least along the "fast axis") between the laser element and the associated reflection element for each laser element. The first optical element can be embodied as a cylindrical lens or else as a rotationally symmetric lens. The lenses can be realized separately or, particularly if embodied as cylindrical lens, as individual segments of a contiguous body. If a rotationally symmetric lens is provided as first collimation element, the radiation along the "fast axis" is collimated well thereby, while there still is divergence present even downstream of this collimation element along the "slow-axis" direction as a result of the line-shape type of the radiation source.

Furthermore, at least one second optical element for collimating the ray bundle (at least along the slow direction) can respectively be arranged in the device, between the first optical element and the associated reflection element for each laser element.

In the device, the spacings of the individual laser elements from the associated reflection elements can be the same or be selected to be so different that the optical path lengths from the respective beam emergence opening of the laser element to a plane that is perpendicular to the beam direction and lies downstream of the reflection elements are the same for all laser elements. In this case, at least one third optical element which collimates the radiation from the ray bundles of all laser elements along the "slow axis" can be arranged in the beam path downstream of the reflection elements. In this case, there advantageously is no second optical element present for collimating the radiation along the "slow axis" between the first optical element and the reflection element.

Furthermore, the waveguides of the laser elements, more particularly planar-design waveguides of broad-stripe laser diodes, can lie in the emission plane in the device. The central lines of the waveguides are then preferably arranged parallel to one another. The wavelength of the emitted ray bundles can lie in the range of approximately 190 nm to approximately 2000 nm, more particularly 250 nm-2000 nm and particularly preferably 600 nm-1550 nm.

In the device according to the invention, the reflecting surface can, in at least one of the reflection elements, have an upper edge that extends parallel to the emission plane. Naturally, it is also possible for a plurality of the reflection elements to be embodied thus. In particular, all reflection elements can be embodied thus, or all reflection elements bar the one above which none of the reflected ray bundles extend.

Provision is furthermore made for a method for beam shaping the ray bundles of a plurality of laser elements which are arranged next to one another on a planar section of an upper side of a heat dissipation body, wherein these laser elements respectively emit a ray bundle, which has a fast-axis divergence and, perpendicular thereto, a slow-axis divergence, and wherein the ray bundles from the individual laser elements are reflected exactly once such that they extend parallel to one another and at an elevation angle of greater than 0° and less than 90° with respect to the planar section, wherein the reflected ray bundles are stacked in the optical path downstream of the respective reflection in a first plane perpendicular to the beam direction of the reflected ray bundles and a connecting line, lying in the first plane, of the centers of the reflected ray bundles extends perpendicular to the direction of the slow axis.

Provision is furthermore made for a method for beam shaping the ray bundles of a plurality of laser elements which are arranged next to one another on a planar section of an upper side of a heat dissipation body, wherein these laser elements respectively emit a ray bundle and wherein the ray bundles from the individual laser elements are reflected exactly once such that they extend parallel to one another and at an elevation angle of greater than 0° and less than 90° with respect to the planar section, wherein the reflected ray bundles are stacked in the optical path downstream of the respective reflection in a first plane perpendicular to the beam direction of the reflected ray bundles and the envelope of the reflected ray bundles in the first plane is a rectangle. In particular, the reflected ray bundles in the first plane are stacked in parallel or parallel in a stripe-shaped manner.

The method according to the invention can be developed in a corresponding manner like the developments of the device according to the invention. Thus, for example, the emitted ray bundles of the laser elements can extend parallel to one another in an emission plane which preferably lies parallel to the planar section.

It is understood that the aforementioned features and the features yet to be explained below can be used not only in the specified combinations, but also in other combinations or on their own without departing from the scope of the present invention.

BRIEF DESCRIPTION OF THE DRAWINGS

In the following text, the invention will be explained in even more detail on the basis of the attached drawings, which also disclose features essential to the invention. In detail.

DETAILED DESCRIPTION

Figure 1:
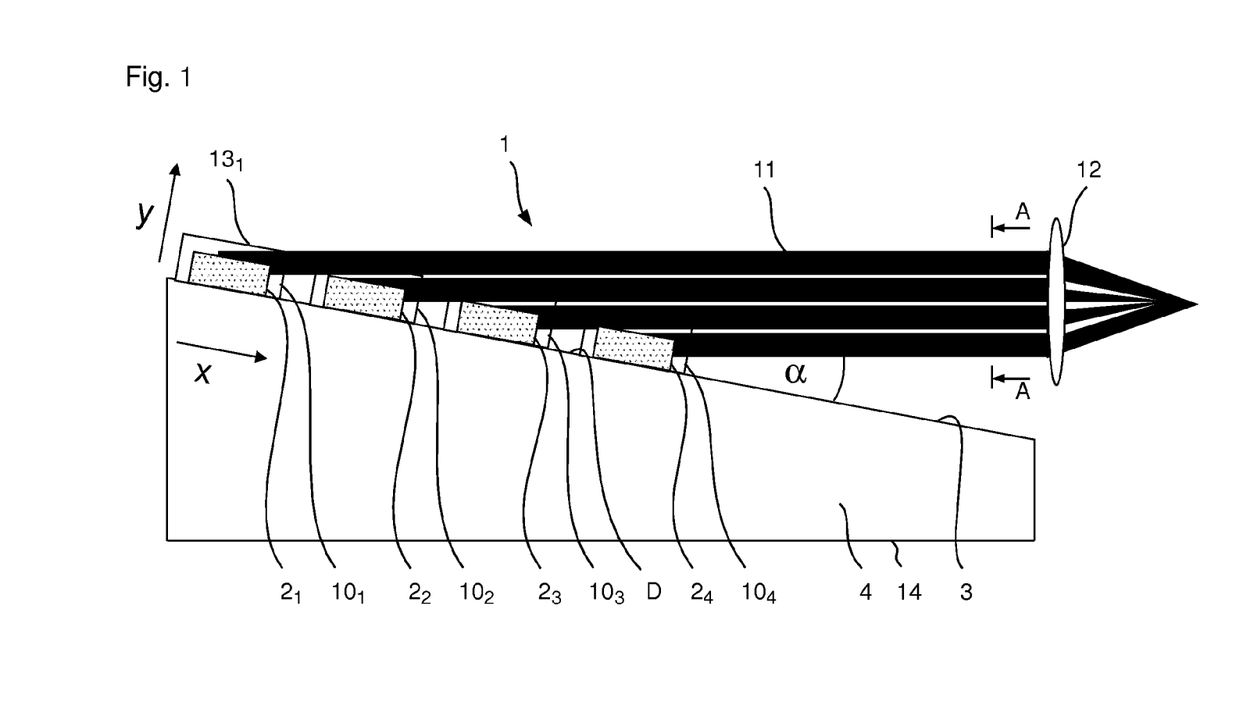
FIG. 1 shows a schematic side view (z-projection) of a first embodiment of the beam shaping device according to the invention.
Figure 2:
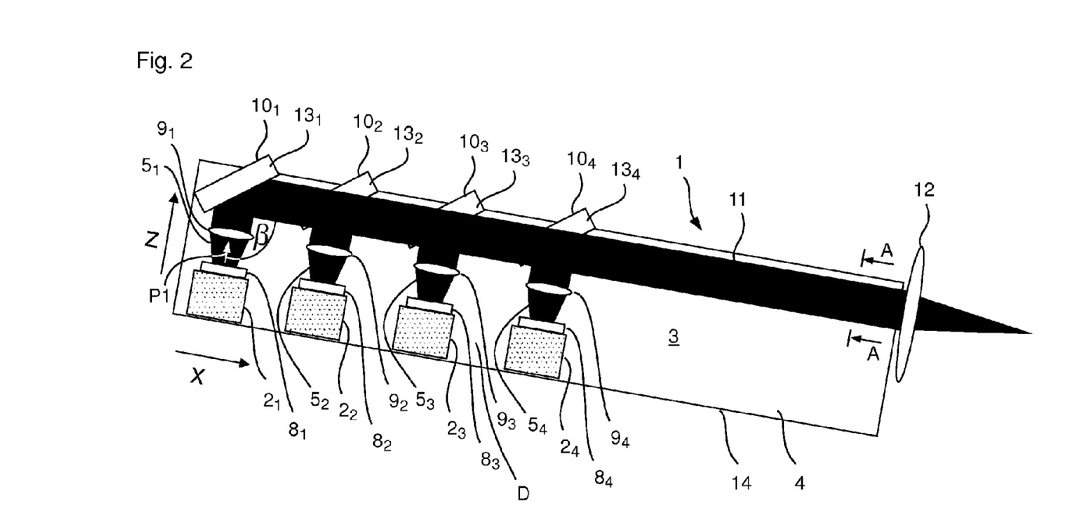
FIG. 2 shows a view (y-projection) of the beam shaping device of FIG. 1.

In the embodiment shown in FIGS. 1 and 2, the beam shaping device 1 comprises four semiconductor laser elements $2_1$, $2_2$, $2_3$ and $2_4$, which are arranged next to one another in an x-direction on a planar section D of an upper side 3 of a heat dissipation body 4. The whole upper side 3 has a planar design in the embodiment described here. However, this is not mandatory.

What is essential is that the laser elements $2_1$-$2_4$ are all arranged on the planar section D.

The laser elements $2_1$, $2_2$, $2_3$ and $2_4$ respectively emit a laser ray bundle $5_1$, $5_2$, $5_3$ and $5_4$, with the emission direction of each ray bundle $5_1$, $5_2$, $5_3$ and $5_4$ being parallel to the planar section D of the upper side 3 and all emission directions likewise extending parallel to one another (in FIG. 2, the arrow P1 shows the emission direction of the ray bundle $5_1$). Hence, the emission direction of each laser element $2_1$, $2_2$, $2_3$ and $2_4$ is in the z-direction (FIG. 2), with all ray bundles $5_1$-$5_4$ lying in an emission plane extending parallel to the planar section D of the upper side 3.

Figure 3A:
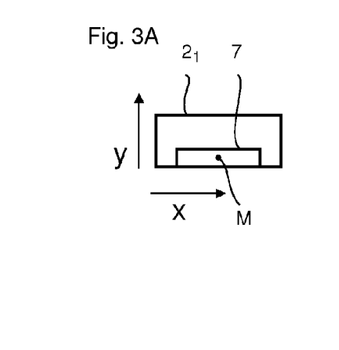
FIG. 3A shows a view from the front of a laser element of the device of FIGS. 1 and 2.

The laser elements $2_1$, $2_2$, $2_3$ and $2_4$ utilized here all have the same design. As shown in FIG. 3A for the laser element $2_1$, they comprise a waveguide 7 which has a central line M extending perpendicular to the plane of the drawing, and a rectangular cross section. The height of the waveguide in the y-direction is approximately 3 μm and the width in the x-direction is approximately 100 μm. Here, the emitted ray bundle has a wavelength from within the range of 630-1100 nm.

Figure 3B:
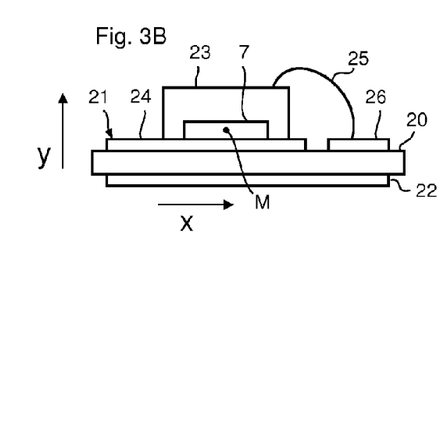
FIG. 3B shows a view from the front of a further embodiment of the laser element of the device of FIGS. 1 and 2.

A further exemplary embodiment for a laser element is shown in FIG. 3B. The laser element has an electrically insulating submount 20, on which a first and second metallization 21 and 22 is applied to the upper and lower side of the submount 20. The laser chip 23 is seated on a first metallization section 24 of the first metallization 21 and is contacted to a second metallization section 26 of the first metallization 21 via bond wires 25. This embodiment permits a series connection of a plurality of laser elements of the arrangement according to the invention in a simple fashion. Thus, the second metallization section 26 can easily be connected to a first metallization section of a laser element of the same design (not illustrated) which is adjacent to the right-hand side. Similarly, the first metallization section 24 can easily be connected to a second metallization section of a laser element of the same design (not illustrated) which is adjacent to the left-hand side.

The cross section in the far field of the emergent ray bundle $5_1$ typically has an elliptical beam cone, with the minor axis extending in the x-direction. This direction is often referred to as "slow direction" or "slow axis", with the typical divergence angle in this direction often being approximately 7 to 15°. The divergence angle in the y-direction, which is often also referred to as "fast direction" or "fast axis", is typically 90° (the x-, y- and z-directions span a Cartesian coordinate system). Since the emitter height (y-direction) of the laser element $2_1$-$2_4$ is only a few μm, the radiation is collimated very well at a "fast-axis" collimation lens with a short focal length (FAC), which is often between 100 μm and 1000 μm, and so the remaining divergence of the radiation along the "fast axis" downstream of this FAC is very small. The beam height is also very small along the fast axis.

As a result of the described arrangement of the laser elements $2_1$, $2_2$, $2_3$ and $2_4$, all waveguides 7 therefore lie in the emission plane, which lies parallel to the planar section D of the upper side 3 of the heat dissipation body 4.

As can be gathered from FIG. 2 in particular, a first collimator $8_1$, $8_2$, $8_3$ and $8_4$ is arranged directly at each laser element $2_1$-$2_4$ and collimates the ray bundles $5_1$-$5_4$ along at least the fast axis (y-direction). At a distance therefrom, a second collimator $9_1$, $9_2$, $9_3$ and $9_4$ is provided for each laser element $2_1$-$2_4$ and serves for collimation along the slow axis (x-direction).

The ray bundles $5_1$-$5_4$ collimated thus respectively impinge on a deflection mirror $10_1$, $10_2$, $10_3$ and $10_4$ associated with the respective laser element $2_1$-$2_4$.

The deflection mirrors $10_1$-$10_4$ are arranged such that the ray bundles $5_1$-$5_4$ reflected thereby extend parallel to one another after the respective reflection (FIG. 1) and the beam propagation direction thereof relative to the planar section D of the upper side 3 has an elevation angle $\alpha$ greater than 0° and less than 90°. In the first exemplary embodiment described here, the elevation angle is approximately 7.8° (drawing not to scale).

It is mentioned for completeness' sake that by setting elevation angles $\alpha$ and azimuth angles $\beta$ of the reflected ray $5_1$-$5_4$ with respect to the incident ray, the position of the mirror normal required for this is uniquely determined. The mirror normals respectively point in the direction of the difference between the normalized emergence and incidence angles of the reference ray. The angle $\gamma$ between the incident ray and the reflected ray emerges from the elevation angle $\alpha$ and the azimuth angle $\beta$ of the reflected ray according to the spherical law of cosines as $\cos\gamma=\cos\alpha\cdot\cos\beta$. Since, according to the law of reflection, ray incidence angle and ray emergence angle are always equal with respect to the mirror normal, the following relationship between the elevation angle $\alpha$ of the reflected ray and the elevation angle $\alpha_S$ of the mirror normal immediately follows from the spherical law of cosines:

$$\frac{\cos 2\alpha - \cos^2\gamma}{\sin^2\gamma} = \frac{\cos 2\alpha_S - \cos^2\frac{\gamma}{2}}{\sin^2\frac{\gamma}{2}}$$

This relationship is used to set the required elevation angle $\alpha_S$ of the mirror normal, which can thereby be determined uniquely.

Furthermore, according to the spherical law of cosines, the follow holds true for the azimuth angle $\beta_S$ of the mirror normal:

$$\cos\beta_S = \frac{\cos\frac{\gamma}{2}}{\cos\alpha_S}$$

This prescription is now used to determine the required azimuth angle of the mirror normal and the mirrors are arranged accordingly.

In this case, the deflection mirrors $10_1$-$10_4$ are copper mirrors with a planar reflection surface, which, compared to the direction of the emergent ray bundle $5_1$-$5_4$, is arranged in the xz-plane at the elevation angle $\alpha_S$ and azimuth angle $\beta_S$ established according to the aforementioned prescription. In this example, the azimuth angle β in the xz-plane is 90° and the elevation angle α is 7.8° with respect to the planar section D on the upper side 3 (drawing not to scale). Accordingly, the mirror normals are to be arranged at an elevation angle $\alpha_S$ of 5.51° and an azimuth angle $\beta_S$ of 44.73°. The angle γ between the incident and the reflected ray then likewise is precisely 90°.

Figure 4:
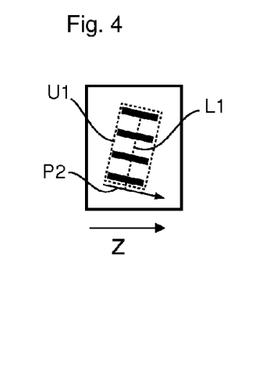
FIG. 4 shows the sectional view A-A as per FIGS. 1 and 2.

The reflected ray bundles together form an emergent ray bundle 11, the cross section of which (section A-A as per FIG. 1) is shown in FIG. 4. The individual reflected ray bundles $5_1$-$5_4$ are arranged parallel to one another such that the envelope U1 is a rectangle. It should still be noted that this rectangle U1 does not have an edge parallel to the xy-plane, but rather it is arranged rotated as can be identified in FIG. 4.

Figure 5A:
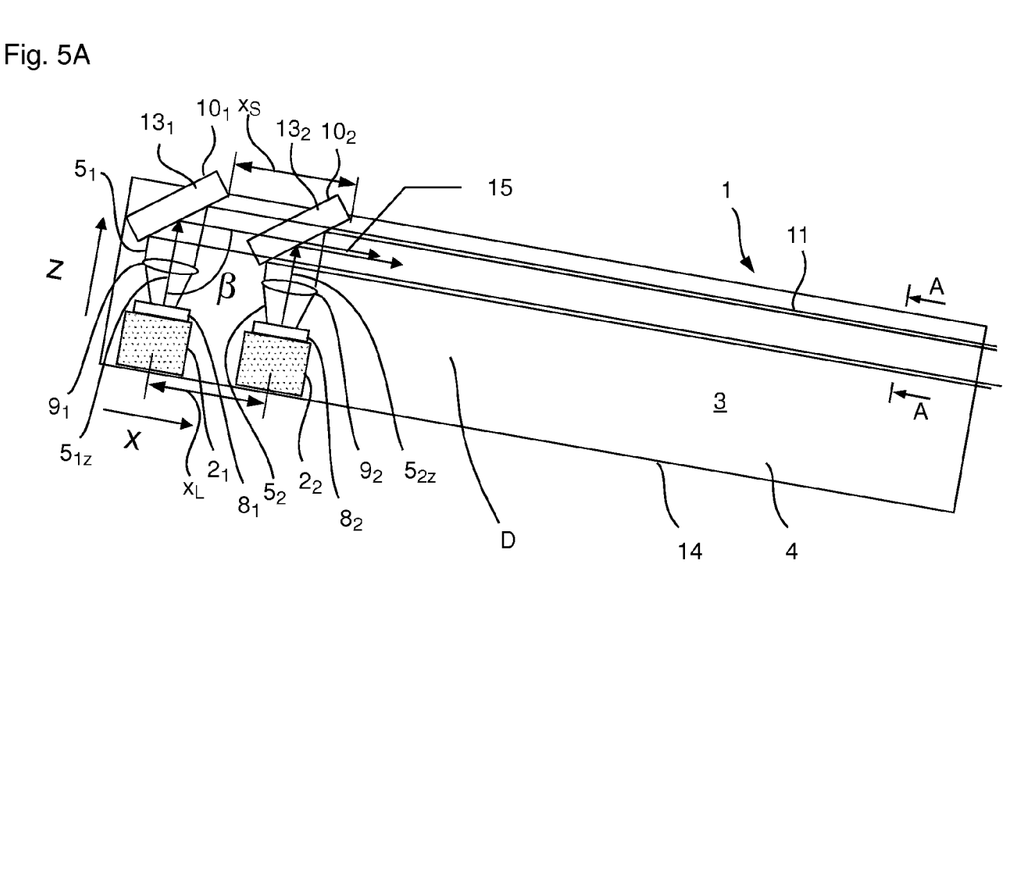
FIG. 5A shows a view (y-projection) of the first embodiment of the beam shaping device according to the invention in order to explain how to obtain the offset of the reflected ray bundles in the z-direction.

In order to obtain an emergent ray bundle 11 with a beam cross section whose envelope U1 is a rectangle such that a connecting line L1 of the centers of the individual reflected ray bundles is perpendicular to the "slow-axis direction" (arrow P2) in the emergent ray bundle 11, as shown in FIG. 4, the ray bundles $5_1$-$5_4$ must be suitably offset with respect to one another in the z-direction after the reflection at the respective deflection mirror $10_1$-$10_4$ (as seen in a projection onto the xz-plane). This offset is denoted by 15 in FIG. 5A.

In the described embodiment, this is achieved by virtue of the fact that the spacing in the x-direction between the reflection surfaces of the deflection mirrors $10_1$-$10_4$ differs from the corresponding spacing of the ray bundles $5_1$-$5_4$. Since this cannot be identified in FIG. 2 on account of displaying the ray bundles as black stripes, FIG. 5A, in an exemplary fashion, shows only the ray bundles $5_1$ and $5_2$, only the laser elements $2_1$ and $2_2$ and only the associated deflection mirrors $10_1$ and $10_2$, wherein the ray bundles $5_1$ and $5_2$ respectively are represented by two lateral marginal rays and a central ray $5_{1z}$ and $5_{2z}$. The central rays $5_{1z}$ and $5_{2z}$ of the two ray bundles $5_1$ and $5_2$ have an offset 15 after reflection at the respective deflection mirror $10_1$ and $10_2$ (in this view, the z-coordinate is defined purely mechanically and not, as is conventional in optics, at the reflection element rotated by the azimuth angle). Naturally, this also applies to all corresponding rays of the reflected ray bundles $5_1$, $5_2$. The necessary offset 15 can easily be established by successively modifying the spacing of the deflection mirrors $10_1$-$10_4$ with respect to the fixedly prescribed spacing of the laser elements $2_1$-$2_4$. In the process, the stripe-shaped images of the ray bundles are displaced in the first plane, corresponding to a rotation of the connecting line of the centers of the ray bundles while the incline of the stripes remains unchanged. The mirror spacing is now optimized in the x-direction such that the connecting line of the centers of the ray bundles is perpendicular to the stripe. This does not present a problem to known ray-tracing programs. In the specified exemplary embodiment, the offset is respectively 0.093 mm in the x-direction compared to the spacing of the laser diodes of 5 mm. In the special case where the azimuth angle β is 90°, the required offset Δx of the mirror elements can, to a good approximation, also be calculated according to the following equation: $\Delta x = x_L \sin\alpha \cdot \tan\alpha$. Here $x_L$ denotes the spacing in the x-direction between two respectively adjacent laser elements. In this case, the offset $\Delta x = x_S - x_L$ is defined as the difference $x_S$ of the spacing in the x-direction between two respectively adjacent mirrors and the spacing $x_L$ in the x-direction between two respectively adjacent laser elements.

Figure 5B:
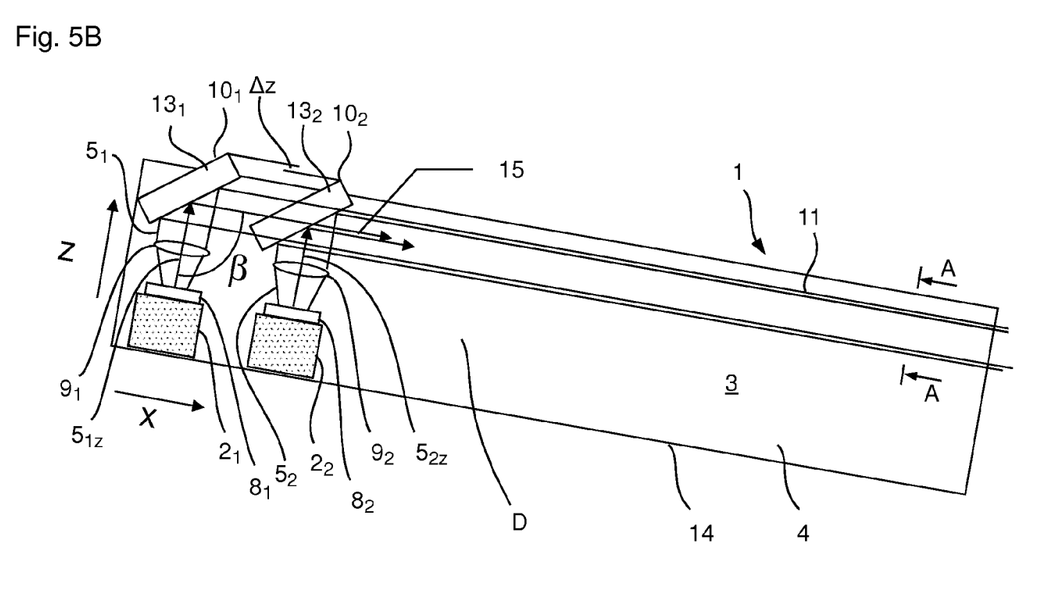
FIG. 5B shows a view as per FIG. 5A of a modification of the first embodiment.

The required offset 15 of the reflected rays can as well be generated by virtue of the fact that the deflection mirrors $10_1$-$10_4$ are correspondingly arranged offset to one another not in the x-direction but in the z-direction, as illustrated schematically in FIG. 5B. In the special case where the azimuth angle is 90°, the required offset Δz can, to a good approximation, be calculated according to the following equation: $\Delta z = -x_L \sin\alpha \cdot \tan\alpha$. The offset $\Delta z = z_{Si+1} - z_{Si}$ is defined here as the difference $z_{Si+1}$ of the z-coordinate of the mirror element number i, i.e. for example mirror $10_2$, and the $z_S$ of the adjacent mirror element number i, i.e. for example mirror $10_1$.

It is naturally possible to combine together both measures for generating the desired offset. However, then the following should hold true: $\Delta x - \Delta z = x_L \sin\alpha \cdot \tan\alpha$, since both displacements influence one another.

Figure 5C:
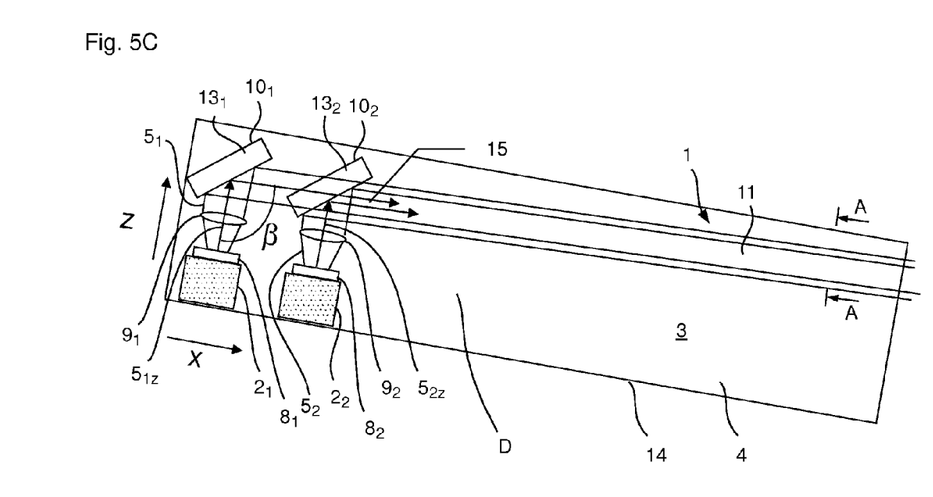
FIG. 5C shows a view as per FIG. 5A of a further modification of the first embodiment.

Alternatively, a beam cross section whose envelope U1 is a rectangle can be achieved without offset of the deflection mirrors $10_1$-$10_4$, i.e. the mirror spacing is likewise 5 mm in the x-direction and there is no z-offset, by virtue of the fact that the deflection mirrors $10_1$-$10_4$ are positioned such that all reflected ray bundles have the same azimuth angle, which has a predetermined value that deviates from 90° (in this case greater than)90°, as illustrated schematically in FIG. 5C. The value depends on the geometric dimensions present. There is, in any case, a value for the azimuth angle at which the envelope U1 is a rectangle. The required azimuth angle in radians can approximately be determined by the following equation:

$$\beta = \frac{\pi}{2} + \arctan(\sin\alpha \cdot \tan\alpha).$$

This equation only applies if there is no x-offset and z-offset of the deflection mirrors and if the elevation angle α is small, i.e. less than 45°. The ray is then deflected by an angle which is approximately, but not exactly, a right angle. Setting this azimuth angle is therefore the third possible measure for realizing the device according to the invention. It is naturally also possible to combine all three measures together. In doing so, it should be noted that, at a predetermined elevation angle α, the required values for Δx, Δz and β influence one another. Therefore only two of these three parameters can be selected freely. There then only exists one possible value for the third parameter. The following approximation for setting the required values for Δx, Δz and β applies in a region of a few degrees about β=90°, where $x_L$ denotes the spacing of adjacent laser elements in the x-direction:

$$\Delta x - \Delta z + x_L \cdot \tan\left(\beta - \frac{\pi}{2}\right) = x_L \cdot \sin\alpha \cdot \tan\alpha.$$

If the angles are specified in degrees, this equation can equivalently be rewritten as: $\Delta x - \Delta z + x_L \tan(\beta - 90°) = x_L \sin\alpha \cdot \tan\alpha$.

If the spacing of the laser elements $2_1$-$2_4$ and hence the spacing of the central rays $5_{1z}$, $5_{2z}$ in the x-direction is 5 mm in the beam shaping device 1, and if the first collimator $8_1$-$8_4$ has a focal length of 600 μm in the fast-axis direction, optimum stacking of the reflected ray bundles $5_1$-$5_4$ is achieved with an elevation angle α of 7.8°. If an azimuth angle β is now selected to be 91.10°, the beam cross section with the rectangular envelope U1, as shown in FIG. 4, is achieved. Accordingly, the mirror normals are to be arranged at an elevation angle $\alpha_S$ of 5.61° and an azimuth angle $\beta_S$ of 45.27°. The angle γ between the incident and reflected rays now is 91.09°.

Figure 6:
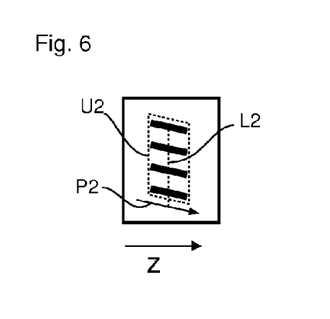
FIG. 6 shows a view as per FIG. 4 with a beam profile according to the prior art without a mirror offset in the x-direction ($\Delta x=0$), without a mirror offset in the z-direction ($\Delta z=0$) and with an azimuth angle of $\beta=90°$.

If an azimuth of 90° were selected in the exemplary embodiment described previously rather than an azimuth angle of 91.3°, the cross section of the emergent ray bundle 11 would have a parallelogram-shaped envelope U2, as shown in FIG. 6. This would correspond to the previously known prior art. Also the connecting line L1 of the centers of the individual reflected ray bundles in the emergent ray bundle 11 would not be perpendicular to the "slow-axis direction" (arrow P2) (which was also transformed at the reflection element). The desired rectangular envelope U1 in the beam cross section of the emergent ray bundle 11 is only achieved by the described suitable choice of the azimuth angle β as a function of the spacing of the laser elements $2_1$-$2_4$ in the x-direction and the elevation angle α.

By way of example, if the laser elements $2_1$-$2_4$ are arranged with a spacing of 2 mm in the x-direction and the collimators $8_1$-$8_4$ have a focal length of 600 μm, it is possible to select an elevation angle α of 13.5° for optimum stacking of the reflected ray bundles. Then, if the mirrors have no x-offset or z-offset, Δx=Δz=0, the azimuth angle β should then be selected as β=93.20° in order to achieve the rectangular envelope U1 in the beam cross section of the emergent ray bundle 11.

The beam shaping device 1 can have (but this is not mandatory) a focusing optical unit 12, as shown in FIGS. 1 and 2. The focusing optical unit 12 serves to focus the emergent ray bundle 11 in order, for example, to be able to couple the latter into an optical fiber.

The deflection mirrors $10_2$-$10_4$ are respectively designed such that they do not, or only slightly, shadow the reflected ray bundle of the respectively preceding deflection mirror $10_1$-$10_3$ and that, secondly, none, or only a small portion, of the associated incident ray bundle radiates over the mirror upper edge without being reflected. To this end, it is possible, for example, that the upper sides $13_2$, $13_3$, $13_4$ of the respective deflection elements $10_2$-$10_4$ shown in FIG. 2 respectively lie in a plane parallel to the planar section D of the upper side 3 and hence parallel to the xz-plane. The upper side $13_1$ of the deflection mirror $10_1$ can (but does not have to because the deflection mirror $10_1$ cannot shadow another reflected ray bundle) likewise extend parallel to the planar section D of the upper side 3.

The upper edges of the reflection elements $10_1$-$10_4$ therefore lie parallel to the ray bundles $5_1$-$5_4$ which are incident on the mirror surface and, to be precise, they advantageously lie such that, in the projection onto the observation plane in the beam direction (FIG. 4 and FIG. 6, which will still be explained below), the upper edges respectively lie in the middle between two ray bundles, possibly with the exception of the first mirror $10_1$, since shadowing cannot occur in the latter anyway. Then the radiation field can be packed most closely in the cross section by setting the optimum elevation angle while having minimal losses as a result of the aforementioned effects (partial irradiation of the incident ray bundle over the mirror, shadowing of the reflected ray bundle by adjacent mirrors).

The illustrated beam shaping device 1 allows very high positioning precision of the individual laser elements $2_1$-$2_4$ because the laser elements $2_1$-$2_4$ are arranged directly on the planar section D of the upper side 3. The planar section D of the upper side 3 can be produced more precisely by orders of magnitude than previously used heat dissipation bodies with a step-like upper side for the individual laser elements. It is also possible to realize very good and homogeneous heat dissipation for all laser elements $2_1$-$2_4$, which is not disturbed by steps in the planar section D of the upper side 3 of the heat dissipation body 4.

Figure 7:
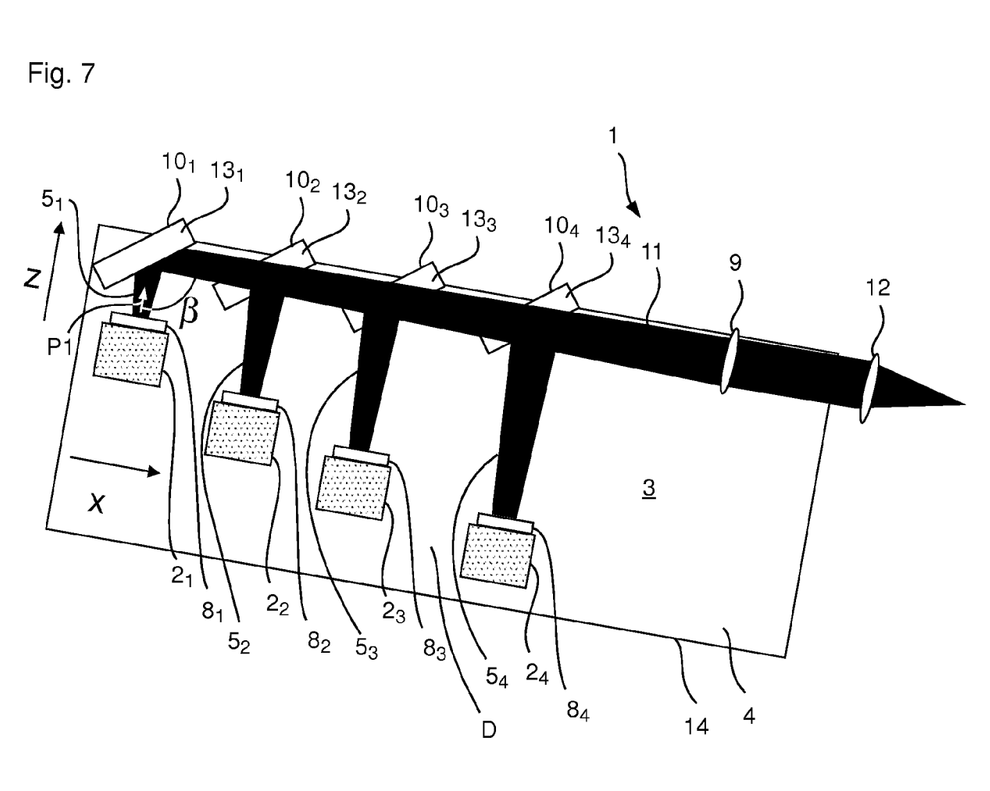
FIG. 7 shows a view (y-projection) of a second embodiment of the beam shaping device according to the invention.

FIG. 7 shows a modification of the beam shaping device 1 according to the invention, wherein the view as per FIG. 7 corresponds to the view of FIG. 2 and the same elements are denoted by the same reference sign and, in respect of the description thereof, reference is made to the explanations above.

The embodiment as per FIG. 7 differs from the previously described embodiment in that the spacings (in the z-direction) between the individual laser elements $2_1$-$2_4$ and the respectively assigned deflection element $10_1$-$10_4$ differ in magnitude. Here, the spacing is selected such that, in the beam cross section of the emergent ray bundle 11, all ray bundles $5_1$-$5_4$ of the laser elements $2_1$-$2_4$ have respectively covered the same optical distance (the illustration in FIG. 7 is only schematic and not to scale). Therefore, the collimation of the ray bundles $5_1$-$5_4$ in the slow-axis direction, between the last deflection mirror $10_4$ and the focusing optical unit 12, can be carried out by means of a single second collimator 9. Hence fewer optical elements are required in the embodiment as per FIG. 7 compared to the embodiment as per FIGS. 1 to 5.

Figure 8:
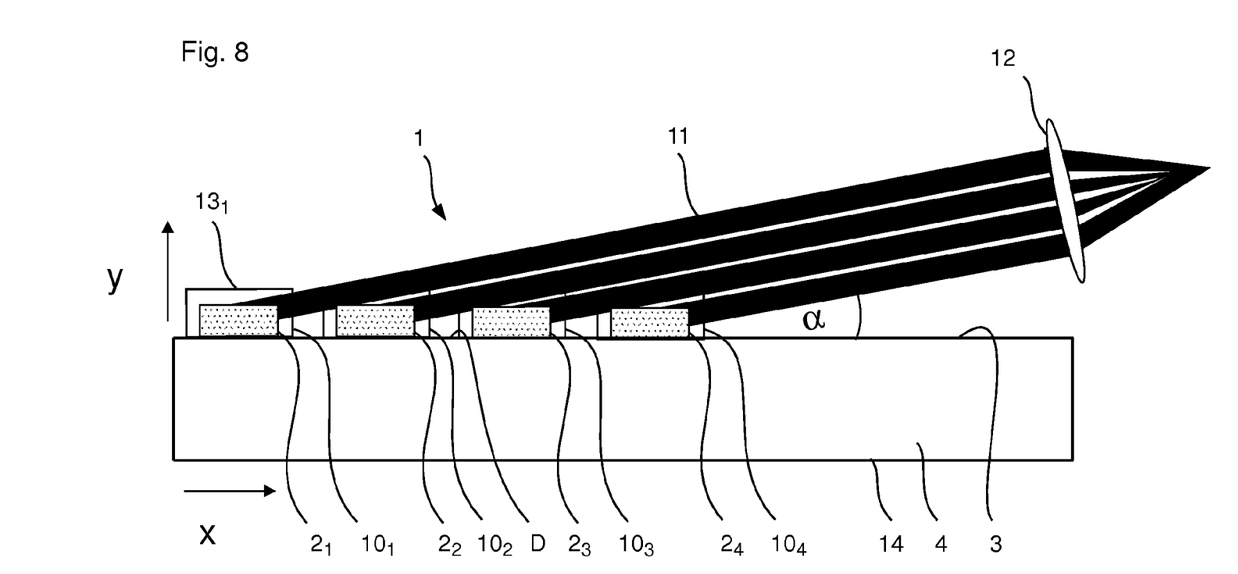
FIG. 8 shows a side view of a further embodiment of the beam shaping device according to the invention.

In the previously described embodiments, the heat dissipation body 4 has a wedge shape in the xy-plane (the upper side 3 is inclined with respect to the lower side 14). However, it is also possible to embody the heat dissipation body 4 as a plane-parallel plate, as illustrated in FIG. 8. In the case of the same relative arrangement of the deflection mirrors $10_1$-$10_4$ with respect to the laser elements $2_1$-$2_4$, as in the previously described embodiments, the emergent ray bundle 11 in turn has the desired azimuth angle β (not shown in FIG. 8) and the desired elevation angle α.

In one development (not shown), provision can be made for two or more of the described beam shaping devices, wherein the respective emergent ray bundles can be superposed to form a larger ray bundle. By way of example, this can be realized for two beam shaping devices by means of a semi-transparent mirror or, preferably, by means of a polarization-selective mirror, which transmits a first polarization direction and reflects a polarization direction orthogonal thereto.

While the invention has been described in connection with what is presently considered to be the most practical and preferred embodiments, it will be apparent to those of ordinary skill in the art that the invention is not to be limited to the disclosed embodiments. It will be readily apparent to those of ordinary skill in the art that many modifications and equivalent arrangements can be made thereof without departing from the spirit and scope of the present disclosure, such scope to be accorded the broadest interpretation of the appended claims so as to encompass all equivalent structures and products.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A device for beam shaping, comprising:
   a heat dissipation body including an upper side, the upper side including a planar section; and
   a plurality of laser elements arranged next to one another on the planar section of the upper side, each of which respectively emit a ray bundle which has a fast-axis divergence and a slow-axis divergence, the slow-axis divergence being perpendicular to the fast-axis divergence,
   wherein a reflection element is associated with each laser element, the reflection element being arranged such that the ray bundles of the individual laser elements extend parallel to one another and at an elevation angle of greater than 0° and less than 90° with respect to the planar section after exactly one reflection at the associated reflection element, wherein the reflected ray bundles of the individual laser elements are stacked in an optical path downstream of the reflection elements in a first plane perpendicular to the beam direction of the reflected ray bundles, and a connecting line, lying in the first plane, of a center of each of the reflected ray bundles extends perpendicular to the direction of the slow axis, wherein the slow axis direction of the ray bundle emitted by the laser elements is in a common plane, and wherein the ray bundles emitted by the laser elements extend parallel to one another in an emission plane, which lies parallel to the planar section.

2. The device of claim 1, wherein an envelope of the reflected ray bundles in the first plane is a rectangle.

3. The device of claim 1, wherein the emission directions of the ray bundles emitted by the laser elements extend parallel to one another in an emission plane.

4. The device of claim 3, wherein a first spacing defined between the laser elements in a first direction extending perpendicular to the emission directions is different from a second spacing defined between the associated reflection elements in the first direction.

5. The device of claim 4, wherein the first spacing is greater than the second spacing.

6. The device of claim 3, wherein adjacent reflection elements are arranged offset with respect to one another in the emission direction.

7. The device of claim 6, wherein the reflection elements are arranged in succession in the reflection direction and each reflection element is, with respect to the preceding reflection element, arranged offset toward the associated laser element in the emission direction.

8. The device of claim 3, wherein the reflection elements are oriented such that all azimuth angles of the reflected ray bundles are not equal to 90°.

9. The device of claim 3, wherein the emission plane lies parallel to the planar section.

10. The device of claim 3, wherein the reflecting surface in at least one of the reflection elements includes an upper edge that extends parallel to the emission plane.

11. The device of claim 1, wherein the reflected ray bundles are stacked parallel in the first plane in a striped fashion.

12. The device of claim 1, wherein the reflected ray bundles, as seen in a projection onto a plane containing the planar section, extend in the same direction and are offset perpendicular thereto with respect to one another.

13. The device of claim 1, wherein at least two of the reflection elements are configured as a contiguous component.

14. The device of claim 1, wherein the heat dissipation body is at least partly wedge-shaped.

15. The device of claim 14, wherein an angle defined between the planar section of the upper side and a lower side of the heat dissipation body corresponds to the elevation angle.

16. The device of claim 1, wherein the heat dissipation body comprises a plane-parallel plate.

17. The device of claim 1, wherein an optical focusing element is arranged in the beam path downstream of the reflection elements and focuses the reflected ray bundles from all laser elements.

18. The device of claim 1, wherein at least one first optical element for collimating the ray bundle is arranged between the laser element and the associated reflection element for each laser element.

19. The device of claim 18, wherein the first optical elements for collimation are embodied as cylindrical lenses, which bring about collimation along the fast axis.

20. The device of claim 19, wherein the cylindrical lenses comprise individual segments of a contiguous body.

21. The device of claim 18, wherein the first optical elements for collimation comprise rotationally symmetric lenses.

22. The device of claim 18, wherein a second optical element for collimating the ray bundle along the slow axis is respectively arranged between the first optical element and the associated reflection element for each laser element.

23. The device of claim 1, wherein a spacing defined between each of the individual laser elements and the associated reflection elements are each selected differently such that the optical path lengths from the respective beam emergence opening of the laser element to a plane that is perpendicular to the beam direction and lies downstream of the reflection elements are the same for all laser elements.

24. The device of claim 23, wherein a third optical element which collimates the radiation from the ray bundles of all laser elements in the slow direction is arranged in the beam path downstream of the reflection elements.

25. The device of claim 1, wherein the laser elements include a waveguide, wherein the waveguides define a central line, wherein the waveguides lie in a common plane, and wherein the central lines of the waveguides are arranged parallel to one another.

26. The device of claim 1, wherein the reflection elements are arranged such that the elevation angle is at least 2° and at most 15°.

27. The device of claim 1, wherein the reflection elements are arranged such that the ray bundles of the individual laser elements extend at an azimuth angle of at least 30° and at most 150° with respect to the emission direction of the laser elements after reflection at the reflection elements.

28. A method for beam shaping ray bundles of a plurality of laser elements, comprising:
    arranging the plurality of laser elements next to one another on a planar section of an upper side of a heat dissipation body,
    emitting via the respective laser elements a ray bundle having a fast-axis divergence direction and, perpendicular thereto, a slow-axis divergence direction, wherein the ray bundles from the individual laser elements are reflected exactly once such that they extend parallel to one another and at an elevation angle of greater than 0° and less than 90° with respect to the planar section, wherein the reflected ray bundles are stacked in the optical path downstream of the respective reflection in a first plane perpendicular to the beam direction of the reflected ray bundles and a connecting line, lying in the first plane, of the centers of the reflected ray bundles extends perpendicular to the slow axis divergence direction, wherein the slow axis divergence direction of the ray bundle emitted by the laser elements is in a common plane, and wherein the ray bundles emitted by the respective laser elements extend parallel to one another in an emission plane, which lies parallel to the planar section.

* * * * *